(12) United States Patent
Hutton

(10) Patent No.: US 6,429,681 B1
(45) Date of Patent: Aug. 6, 2002

(54) PROGRAMMABLE LOGIC DEVICE ROUTING ARCHITECTURE TO FACILITATE REGISTER RE-TIMING

(75) Inventor: Michael D. Hutton, Mountain View, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/781,056

(22) Filed: Feb. 9, 2001

Related U.S. Application Data
(60) Provisional application No. 60/227,557, filed on Aug. 23, 2000.

(51) Int. Cl.[7] .............................................. H03K 19/177
(52) U.S. Cl. ........................................... 326/41; 326/38
(58) Field of Search ........................................ 326/37–41

(56) References Cited

U.S. PATENT DOCUMENTS

| | | | |
|---|---|---|---|
| 5,550,782 A | 8/1996 | Cliff et al. ............. | 365/230.03 |
| 5,689,195 A | 11/1997 | Cliff et al. ..................... | 326/41 |
| 6,107,825 A * | 8/2000 | Lane et al. .................... | 326/41 |
| 6,215,326 B1 * | 4/2001 | Jefferson et al. ............... | 326/41 |
| 6,272,655 B1 * | 8/2001 | Hecht et al. ................. | 714/725 |

OTHER PUBLICATIONS

U.S. Patent applicaton No. 09/266,235, Jefferson et al., filed Mar. 10, 1999.

Giovanni De Micheli, *Synthesis and Optimization of Digital Circuits*, McGraw–Hill, Inc., New York, 1994, Chapter 9, pp. 441–503.

\* cited by examiner

*Primary Examiner*—Michael Tokar
*Assistant Examiner*—Vibol Tan
(74) *Attorney, Agent, or Firm*—Fish & Neave; Manu J. Tejwani; Jeffrey C. Aldridge

(57) ABSTRACT

A programmable logic device has registers ("re-timing registers") associated with interconnection conductors. The re-timing registers are in addition to registers that are conventionally associated with other device elements such as logic and memory cells. Programmable links enable optional data paths through the re-timing registers between disconnected segments of interconnection conductors. Re-timing techniques for optimization of circuit designs seeking to minimize the longest register-to-register path can include positioning of re-timing registers on interconnection conductors. Long interconnection conductors can be used in data paths between device elements with only short segments of interconnection conductors contributing to critical path lengths.

50 Claims, 5 Drawing Sheets

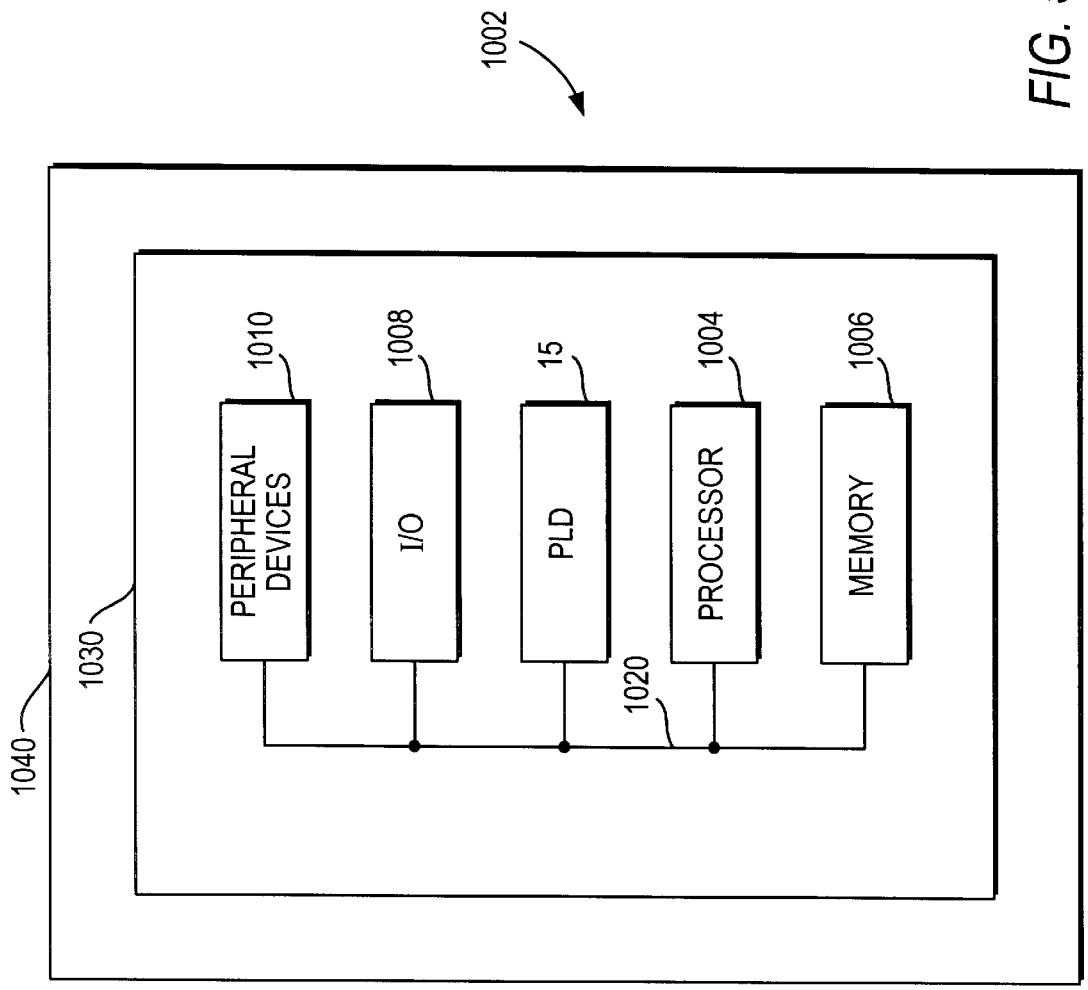

PROGRAMMABLE LOGIC DEVICE ROUTING ARCHITECTURE TO FACILITATE REGISTER RE-TIMING

This application claims the benefit of U.S. provisional patent application No. 60/227,557, filed on Aug. 23, 2000, which is hereby incorporated by reference herein in its entirety.

BACKGROUND OF THE INVENTION

Programmable logic devices (PLDs) are integrated circuit devices with configurable logic networks linked together by programmable interconnection resources. The configurable logic networks may include device elements such as logic cells (e.g., look-up tables (LUTs) or product term logic), memory cells, and input-output cells. Registers (e.g., D-type flip-flops) may be associated with one or more of the device elements. The registers hold and transfer data signals (i.e., variables) between the device elements during device operation.

The device elements of a conventional PLD are often architecturally organized into blocks of programmable logic (e.g., gate arrays), blocks of input-output cells, and blocks of memory (e.g., random access memory ("RAM")), etc. Groups of these blocks may make up larger blocks (i.e., "super-regions") that are arranged, for example, in an X-Y array. The programmable interconnection resources of the PLD are organized as rows and columns of conductors for selectively routing signals to, from, and between the logic, input-output, and memory blocks. See, for example, Cliff et al. U.S. Pat. No. 5,550,782, Cliff et al. U.S. Pat. No. 5,689,195, and Jefferson et al. U.S. patent application Ser. No. 09/266,235, filed Mar. 10, 1999, all of which show PLD architectures developed by Altera Corporation of San Jose, Calif.; but other examples of architectures with which the present invention can be used include those developed by other PLD manufacturers such as Xilinx, Inc., also of San Jose, Calif.

Complex logic functions (circuits), as desired, may be implemented in present-day PLDs. The logic functions are implemented by interconnecting a select configuration of device elements according to a suitable circuit design. Conventional circuit design techniques for synthesis of logic functions may be used to generate a suitable circuit design. The circuit design may be characterized by a corresponding configuration file (i.e., a netlist) that specifies the placement and interconnection of selected device elements. PLDs usually have a large number of device elements that have identical functionality (e.g., AND gates) and which may be used interchangeably. Therefore, several possible circuit designs (i.e., configurations of device elements) may yield the same desired logic function.

The circuit design which is implemented is, usually, optimized for circuit performance. A measure of circuit performance is data signal propagation delay. This delay depends, inter alia, on the length of interconnection and on the number of registers between device elements traversed by data signals. A figure of merit of circuit delay performance is the length (in units of time) of the longest register-to-register delay path ("the critical path") in the circuit.

Critical path length may be minimized using "re-timing" techniques for optimizing circuit designs. These techniques address the problem of optimal placement and interconnection of device elements by repositioning registers along the path of data signals. Registers associated with logic cells are repositioned from the cells' output to input or vice versa, so that the critical path is as short as possible (see, De Micheli Giovanni, Synthesis and Optimization of Digital Circuits, McGraw-Hill, Inc., 1994, Chapter 9, TK7874.65 D4). Local network topology as well as overall architecture of a PLD determine the efficacy of re-timing optimization of circuit designs that can be implemented in the PLD.

The local network topology may impede the repositioning of registers. For example, moving a register through a multiple fan-in logic cell requires duplicating the register at each fan-in input. However, positioning a register on an input of the multiple fan-in logic cell may be precluded by the presence of an already existing register on the input. As another example, moving a register to an output of a multiple fan-out source logic cell may change the latency (i.e., the number of cycles for execution) of the other outputs of the source logic cell.

Additionally, the architecture of a PLD itself may restrict possibilities for repositioning registers. For example, the PLD architecture may partition the device into a hierarchy of regions and require use of long interconnections between the regions (see, for example, Jefferson et al. U.S. patent application Ser. No. 09/266,235, filed Mar. 10, 1999). Some circuit designs must use device elements in different regions. For these designs, repositioning of registers along the data path between the device elements in different regions cannot reduce critical path length below the length of a long interconnection that must be used.

A further drawback of re-timing optimization, irrespective of local topology and PLD architecture, is that any significant changes in the number of registers make simulation and verification of circuit designs computationally expensive.

Consideration is now being given to ways of enhancing programming logic device architectures to increase flexibility in re-timing optimization of circuit designs.

SUMMARY OF THE INVENTION

In accordance with the present invention, programmable logic device architectures are enhanced by additionally providing one or more registers ("re-timing registers") associated exclusively with interconnection resources. These re-timing registers are not associated with any individual device element such as a logic cell, memory cell, or an input-output cell, and are in addition to registers that are conventionally associated with individual device elements.

PLDs with a hierarchical architecture may have segments of interconnection conductors buffered at hierarchical partition boundaries. For these PLDs, the provided re-timing registers are placed in parallel to segmentation buffers. Additionally, programmable links are provided to enable data paths between disconnected segments of conductors. The data paths are enabled through the re-timing registers bypassing the segmentation buffers. Re-timing optimization of circuit designs can utilize positioning of re-timing registers on interconnection conductors, independent of local circuit topology. Long interconnections between regions across the partition boundaries are enabled with only short segments of the interconnection conductors contributing to register-to-register path lengths.

Further features of the invention, its nature and various advantages will be more apparent from the accompanying drawing and the following detailed description.

BRIEF DESCRIPTION OF THE DRAWING

FIG. 5 is a simplified block diagram of an illustrative system employing a programmable logic device in accordance with the invention.

DETAILED DESCRIPTION

The present invention is described in the context of the programmable logic device architecture disclosed in Jefferson et al. U.S. patent application No. Ser. 09/266,235, filed Mar. 10, 1999, incorporated by reference herein in its entirety. The architecture disclosed in the Jefferson et al. reference is used only for purposes of illustration, with the understanding that the inventive principles of the present invention are applicable to all PLD architectures.

The Jefferson et al. reference discloses a PLD architecture which partitions the PLD into a hierarchy of regions. In particular, imaginary vertical and horizontal lines partition the PLD into four quadrants. Long horizontal and vertical conductors are provided for interconnection from one quadrant to another. The long conductors are segmented at the partition boundaries by programmable segmentation buffers. The segmentation buffers may be programmed to allow independent use of either of the half lengths or the full length of a long conductor as necessary. The segmentation buffers may be implemented using any suitable switching circuitry. The segmentation buffers may, for example, be implemented using tri-state buffers (see e.g., FIG. 1 discussed below) or pass transistors (e.g., CMOS transmission gates).

In accordance with the present invention re-timing registers that are associated exclusively with the long conductors are provided. A conductor may have one or more associated registers for optional use. Additionally or alternatively a group of conductors may be associated with one or more of the same re-timing registers.

Figure 1:
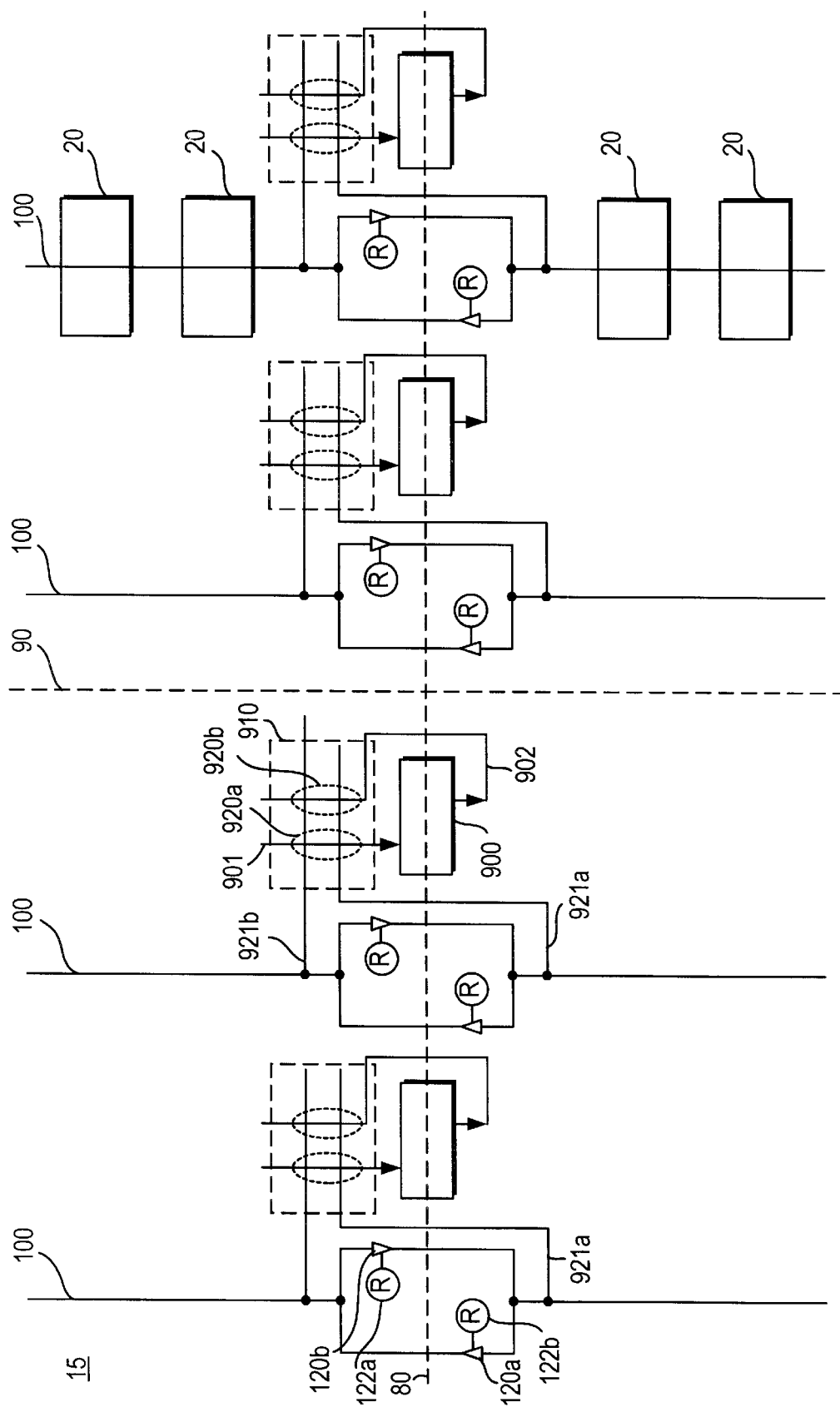
FIG. 1 is a schematic diagram illustrating provision of re-timing registers in parallel to segmentation buffers on conductors, in accordance with the invention.

FIG. 1 shows, for example, four vertical conductors 100, each associated with a column of architectural blocks (super-regions) 20. For clarity, super-regions 20 are shown for only the rightmost vertical conductor in FIG. 1. Vertical conductors 100 allow communication to, from, and between super-regions 20 in the associated super-region column. At approximately their midpoints vertical conductors 100 cross partition boundary 80 that horizontally divides PLD 15 into two halves. Vertical conductors 100 are segmented at their midpoints by programmable segmentation buffers 120a and 120b. Each segmentation buffer 120 is controlled by an associated programmable function control element ("FCE") 122a or 122b. The FCEs 122 associated with a vertical conductor 100 can be programmed to disable both of the associated buffers 120, in which case each half of the conductor 100 can be used separately and independently. Alternatively, either one of the FCEs 122 associated with a conductor 100 can be programmed to enable the associated buffer 120, in which case one half of the conductor drives the other half. For example, if the buffer 120a of a conductor 100 is enabled, the lower half of that conductor drives the upper half. In this way the two halves of a conductor 100 can be used together.

FIG. 1 also shows re-timing registers 900 associated with vertical conductors 100. Each register 900 has an input lead 901 and an output lead 902. Every vertical conductor 100 shown has one register 900 available for optional use. Programmable links 910 selectively connect registers 900 to associated conductors 100 in parallel with segmentation buffers 120. Links 910 may, for example, be programmable FCE-controlled cross point switches 920 with switch wires 921 leading to conductors 100.

During re-timing optimization of a circuit design, it may be desirable to reposition a register associated, for example, with a logic element that is driving or is being driven by a conductor 100. The register may be repositioned on the conductor 100 using re-timing register 900 associated with the conductor 100. Register 900 is positioned on the conductor 100 by disabling the associated segmentation buffers 120 to disconnect the two halves of the conductor 100. Instead, programmable link 910 is activated to provide a data path through register 900 between the two disconnected halves of the conductor 100. The data path may be directed through register 900 with an appropriate input-output orientation using, for example, cross point switches 920 in programmable links 910. The input-output orientation may be programmed according to whether the lower half of the conductor is driving the upper half of the conductor or vice versa. For example, if the upper half is driving the lower half, the upper half is connected to drive register input lead 901 and register output lead 902 is connected to drive the lower half. With these connections, a signal on the driving half-conductor 100 can travel over input lead 901 to register 900. Register 900 can register the signal and then pass it over output lead 902 to the driven half-conductor 100.

Figure 2:
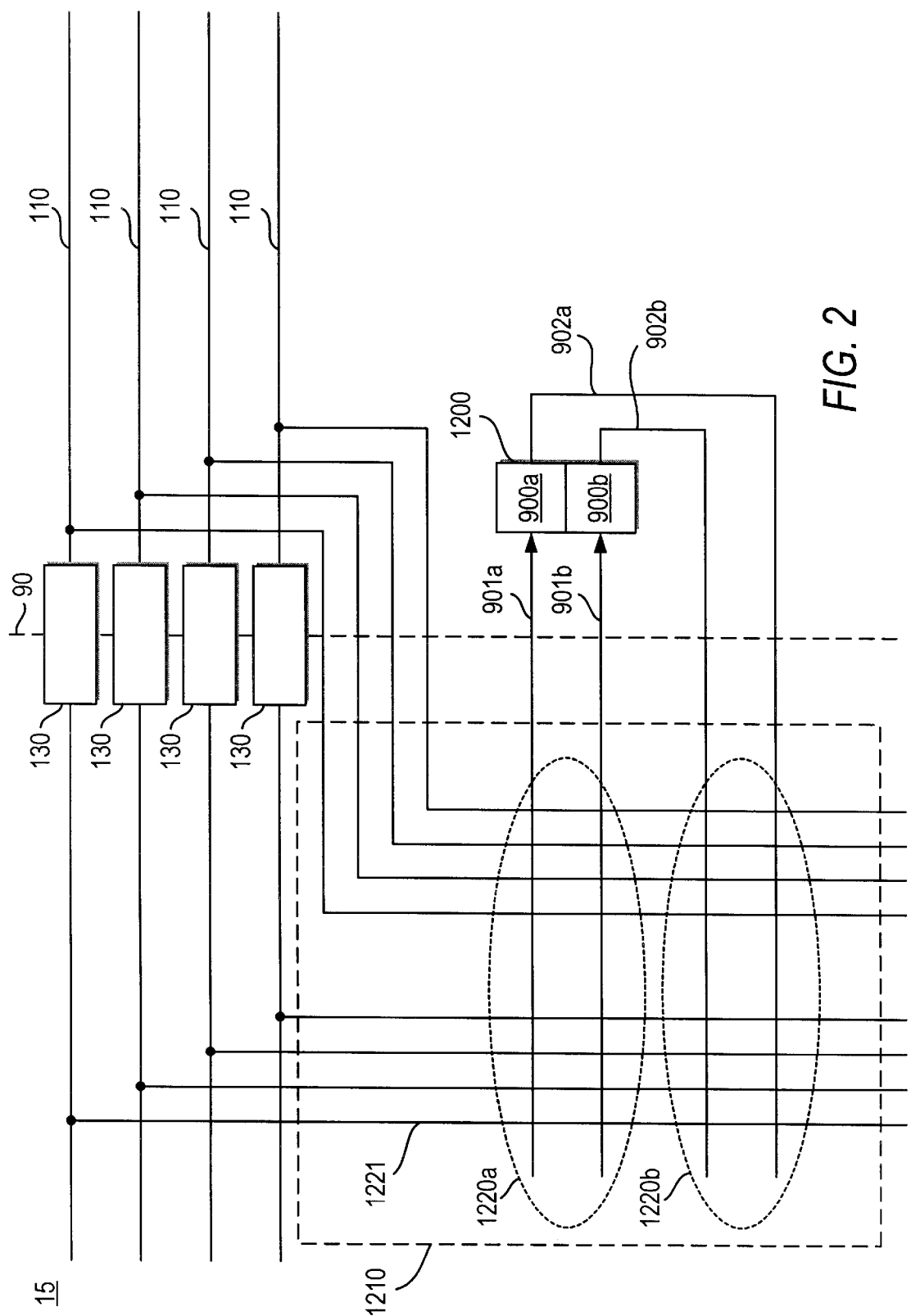
FIG. 2 is a schematic diagram illustrating provision of a block of re-timing registers in parallel to segmentation buffers on a set of conductors, in accordance with the invention.

FIG. 2 shows four horizontal conductors 110, each associated with a row of architectural blocks (super-regions) 20. For clarity, super-regions 20 are not shown in FIG. 2. Horizontal conductors 110 allow communication to, from, and between super-regions 20 in the associated super-region row. At approximately their midpoints horizontal conductors 110 cross partition boundary 90 that vertically divides the PLD into two halves. Horizontal conductors 110 are segmented at their midpoints by programmable segmentation buffers 130. For clarity the detailed circuitry of buffers 130 is not shown in FIG. 2. It is understood that buffers 130 operate similarly to buffers 120 shown in FIG. 1. Buffers 130 may be disabled to enable disconnected halves of conductors 110 to be used separately and independently.

FIG. 2 also shows register circuitry including register block 1200 and programmable links 1210 associated with, for example, four conductors 110. Register block 1200 includes a set of, as shown for example, two re-timing registers 900. Each register 900 has its own input lead 901 and output lead 902. Programmable links 1210 connect register block 1200 to associated conductors 110, bypassing segmentation buffers 130. Links 1210 may, for example, include programmable, FCE-controlled cross point switches 1220 with switch wires 1221 leading to conductors 110. For re-timing optimization of circuits, links 1210 provide the flexibility of positioning either of registers 900 in a data path connecting any disconnected left-half conductor 110 to any disconnected right half conductor 110. The conductor 110 halves thus connected via either of re-timing registers 900 do not have to be halves that are served by one bi-directional buffer circuit 130. For example, the top-left half-conductor 110 can be connected to the bottom-right half-conductor 110 via either of re-timing registers 900. As another example, the top-left half-conductor 110 can be connected to drive any two or more of the right-half conductors 110 via either of registers 900. The driving and driven half-conductors can even be on the same side of boundary 90 if desired. Cross point switches 1220 enable connections to registers 900 to be oriented so that the driving halves of conductors 110 are connected to register inputs 901 while the driven halves of conductors 110 are connected to register outputs 902. With these connections, a signal on a driving half-conductor 110 can travel over an input lead 901 to connected register 900. Register 900 can register the signal and then pass it over its output lead 902 to one or more connected driven half-conductors 110. Any left- or right-half conductor 110 can be either a driving or driven conductor.

Although FIG. 2 shows two re-timing registers 900 being shared by four conductors 110, it will be understood that a different ratio between conductors and re-timing registers can be used if desired. For example, fewer registers can be provided in relation to the number of conductors, or more registers (up to a number equal to the number of conductors) can be provided, as desired.

Figure 3:
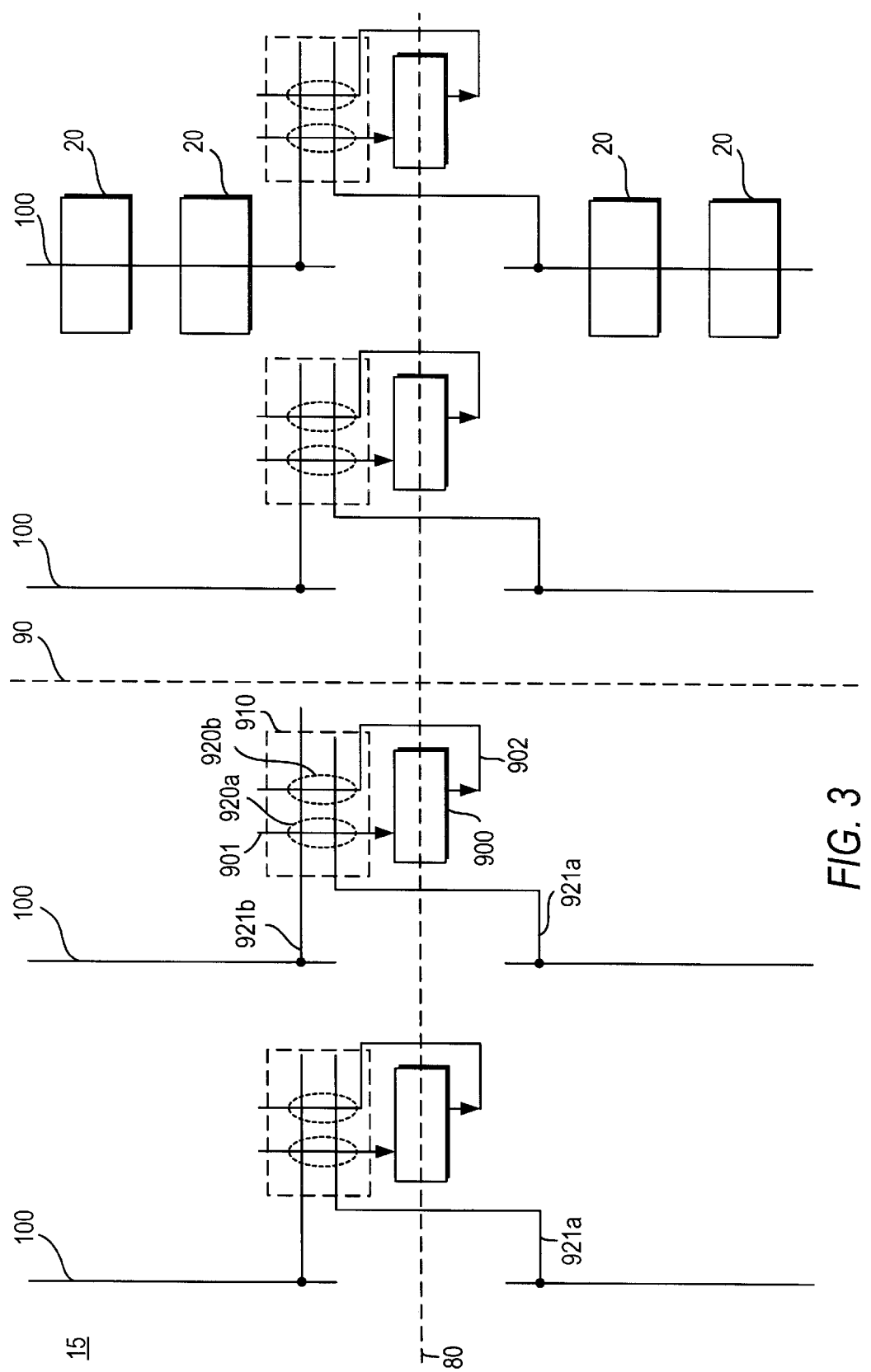
FIGS. 3 and 4 illustrate a modified PLD architecture and correspond to FIGS. 1 and 2, respectively, with segmentation buffers removed in accordance with the invention.
Figure 4:
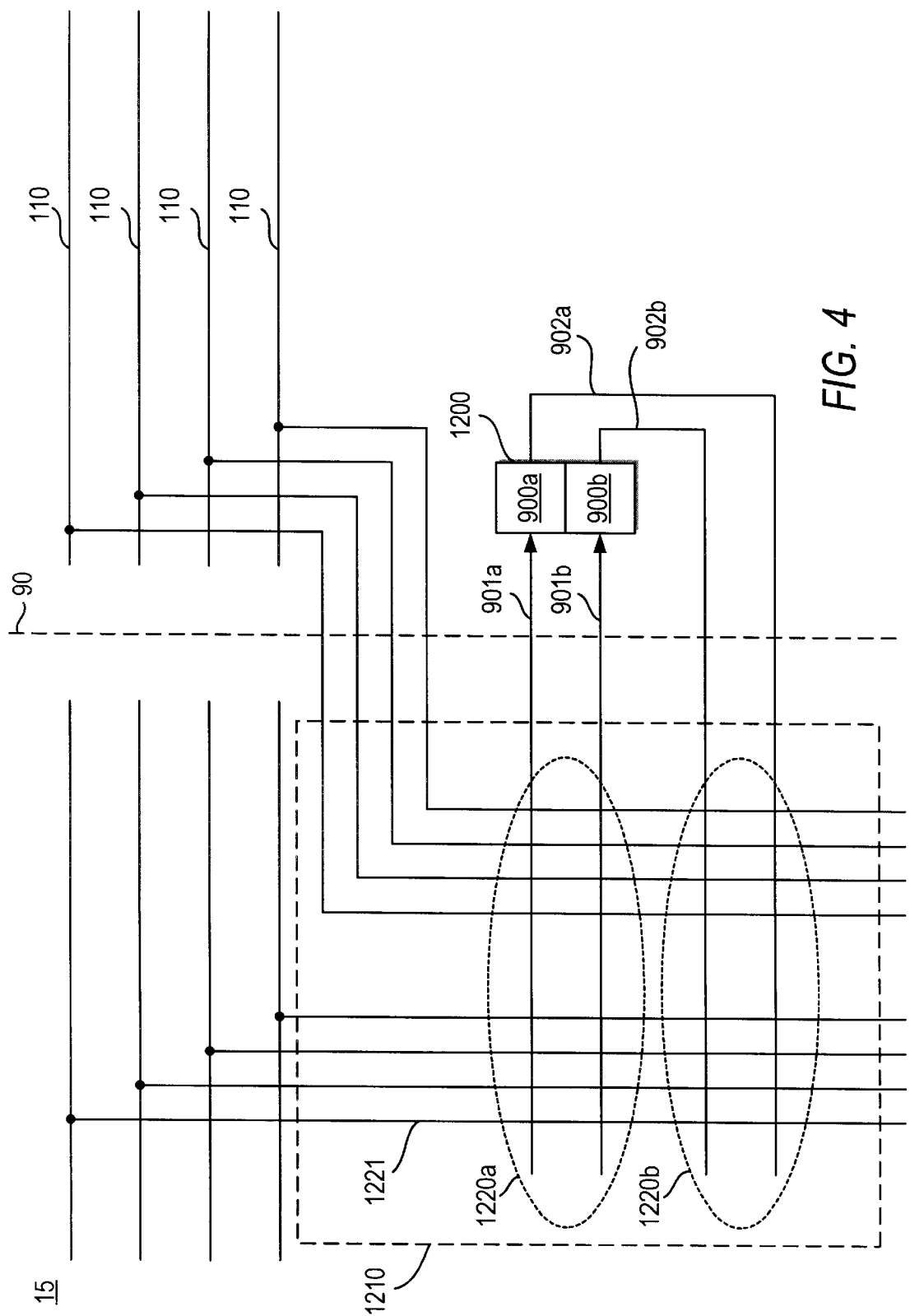

PLD architectures may be further modified to omit programmable segmentation buffers for conductors that have associated re-timing registers available for use. Such modification may reduce costs associated with providing programmable segmentation buffers in PLDs. FIG. 3 shows conductors 100 in a modified architecture without programmable segmentation buffers 120 (conductors 100 were shown earlier in FIG. 1 with buffers 120). Conductor 100 segments above partition boundary 80 are physically disjoint from segments below partition boundary 80, in the absence of buffers 120. Similarly, FIG. 4 shows conductors 110 under the modified architecture without programmable segmentation buffers 130 (conductors 110 were shown earlier in FIG. 2 with buffers 130). Conductor 110 segments to the left of partition boundary 90 are physically disjoint from segments to the right of partition boundary 80, in the absence of buffers 130.

In this modified PLD architecture, data paths between device elements across partition boundaries 80 and 90 may be established using associated re-timing registers 90 to link physically disjoint segments of conductors 100 and 110. The linking of disjoint segments can occur in the same manner as the linking of segments disconnected by disabling buffers 120 and 130 discussed above with reference to FIGS. 1 and 2.

It will be appreciated by those skilled in the art that commonly used register control signals (e.g., clear, reset, clock, and enable) that are generated by surrounding logic in conventional PLD operation are appropriately routed and made available for operation of re-timing registers 900 of the present invention.

It will be appreciated that the ability to position re-timing registers on long conductors allows shorter segments of the long conductors than otherwise possible (e.g., in conventional PLDs) to be included in critical path lengths, without affecting circuit logic. In the examples shown above in FIGS. 1–4, re-timing registers can be positioned at the mid-points of the conductors so that the shorter segments that can be included in critical paths are half lengths. In accordance with the present invention, re-timing registers may be provided additionally or alternatively at any other suitable fractional lengths (e.g., about one-third or one-quarter lengths) corresponding to suitable hierarchical partition boundaries in the PLD architecture. The fractional lengths at which re-timing registers are provided may vary from one conductor to another conductor. For example, in some PLD architectures the starting positions or the lengths of interconnection conductors may be staggered (i.e., offset) from one row (or column) to the next. In such PLD architectures re-timing registers may be provided at varying fractional lengths and/or at locations which are staggered or shifted relative to one another from one conductor or group of conductors.

Every long horizontal and vertical conductor in a PLD may have its own associated re-timing registers for optional use as illustrated in FIGS. 1 and 3 above. Typical PLDs may have several hundreds of long conductors. However, typical circuit designs implemented in the PLDs generally have no more than a few long conductors in their critical paths. Providing every conductor with its own associated re-timing registers may be unnecessarily expensive. The expense of providing large numbers of re-timing registers in a PLD may be reduced by making a smaller number of re-timing registers available in common to a larger number of conductors as illustrated in FIGS. 2 and 4 above.

Using PLDs constructed according to the present invention, re-timing techniques for optimizing circuit designs may be limited to primarily repositioning registers on long conductors. Repositioning registers on conductors which are single fan-in fan-out structures does not require register duplication. Conventional difficulties associated with register duplication, for example, on multiple fan-in or fan-out logic cells are, therefore, avoided. Since long conductors often contribute the largest lengths to the critical path, this limitation, in most cases, does not diminish the efficacy of re-timing optimization. Further, the limitation reduces the magnitude of change in the number of registers along a data path, otherwise possible as a result of unlimited re-timing optimization. A smaller change in the number of registers reduces computing costs associated with circuit design simulation and verification.

The registers that are provided in accordance with this invention for use in re-timing signals between interconnection conductor segments are preferably dedicated to such use. In other words, they are preferably not part of other resources on the device that may have other uses such as the ability to perform logic. These dedicated, signal re-timing registers are therefore preferably provided in addition to and substantially separate from the other resources (which may include other registers) conventionally provided on the programmable logic device.

FIG. 5 illustrates a programmable logic device 15 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 15 can be used to perform a variety of different logic functions. For example, programmable logic device 15 can be configured as a processor or controller that works in cooperation with processor 1004. Programmable logic device 15 may also be used as an arbiter for arbitrating access to a shared resource in system 1002. In yet another example, programmable logic device 15 can be configured as an interface between processor 1004 and one of the other components in system 1002. It should be noted that system 1002 is only exemplary, and that the true scope and spirit of the invention should be indicated by the following claims.

Various technologies can be used to implement the programmable logic devices of this invention, as well as the various components of those devices (e.g., the above-described registers and programmable links). For example, the programmable links can be a relatively simple programmable connector such as a FCE-controlled switch or a plurality of switches for connecting any one of several inputs to any one of several outputs, as mentioned above. Alternatively, each programmable link can be a somewhat more complex element which is capable of performing logic (e.g., by logically combining several of its inputs) as well as making a connection. In the latter case, for example, each programmable link can be product term logic, implementing functions such as AND, NAND, OR, or NOR. Examples of components suitable for implementing programmable links are EPROMs, EEPROMs, pass transistors, transmission gates, antifuses, laser fuses, metal optional links, etc. As has been mentioned, the components of the programmable links can be controlled by various, programmable, function control elements ("FCEs"). (With certain programmable link implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferroelectric memories, fuses, antifuses, or the like. From the various examples mentioned above it will be seen that this invention is applicable to both one-time-only programmable and reprogrammable devices. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the number of device element blocks at each of the various levels in the hierarchy of device element blocks, and the type of the hierarchy itself, can differ from the specific examples mentioned herein. Similarly, the numbers of the various types of interconnection conductors and other elements can deviate from the specific examples mentioned herein. Different types and sizes of logic and memory units and registers can be used if desired. It will also be understood that terms like "row" and "column", "horizontal" and "vertical", "left" and "right", "top" and "bottom", and other directional or orientational terms are used herein only for convenience, and that no fixed or absolute orientations are intended by the use of these terms. For example, the words in each of the word pairs mentioned above can be reversed if desired.

What is claimed is:

1. A programmable logic device comprising:
   a plurality of regions separated by partition boundaries;
   a plurality of device elements for performing logic functions, disposed on said plurality of regions;
   programmable interconnection resources for selectively linking said plurality of device elements; and,
   registers associated with said interconnection resources for registering signals traveling on said interconnection resources.

2. The programmable logic device defined in claim 1 wherein said interconnection resources comprise a plurality of conductors for linking device elements across said partition boundaries and said conductors are segmented at said partition boundaries by programmable segmentation buffers which can be disabled to disconnect segments of said conductors, said device further comprising programmable links for optionally linking one of said registers to disconnected segments of one of said conductors.

3. The programmable logic device defined in claim 2 wherein said disconnected segments of one of said conductors comprise a driving segment and a driven segment, and said programmable links comprise circuitry for connecting said one register's input and output to said driving segment and said driven segment, respectively.

4. The programmable logic device defined in claim 3 wherein said circuitry comprises a cross point switch.

5. The programmable logic device defined in claim 1 wherein said interconnection resources comprise a plurality of conductors for linking device elements across said partition boundaries and said conductors are segmented at said partition boundaries by programmable segmentation buffers which can be disabled to disconnect segments of said conductors, said device further comprising programmable links for optionally linking a first number of said registers to disconnected segments of a second number of said conductors.

6. The programmable logic device defined in claim 5 wherein said first number is not greater than said second number.

7. The programmable logic device defined in claim 5 wherein said disconnected segments of a second number of said conductors comprise driving segments and driven segments, and said programmable links comprise circuitry for connecting said first number of registers' inputs and outputs to said driving segments and said driven segments, respectively.

8. The programmable logic device defined in claim 7 wherein said circuitry comprises a cross point switch.

9. The programmable logic device defined in claim 1 wherein said interconnection resources comprise a plurality of conductors for linking device elements across said partition boundaries and said conductors are physically disjoint at said partition boundaries, said device further comprising programmable links for optionally linking one of said registers to disjoint segments of one of said conductors.

10. The programmable logic device defined in claim 9 wherein said disjoint segments of one of said conductors comprise a driving segment and a driven segment, and said programmable links comprise circuitry for connecting said one register's input and output to said driving segment and said driven segment, respectively.

11. The programmable logic device defined in claim 10 wherein said circuitry comprises a cross point switch.

12. The programmable logic device defined in claim 1 wherein said interconnection resources comprise a plurality of conductors for linking device elements across said partition boundaries and said conductors are physically disjoint at said partition boundaries, said device further comprising programmable links for optionally linking a fifth number of said registers to disjoint segments of a sixth number of said conductors.

13. The programmable logic device defined in claim 12 wherein said fifth number is not greater than said sixth number.

14. The programmable logic device defined in claim 12 wherein said disjoint segments of a sixth number of said conductors comprise driving segments and driven segments, and said programmable links comprise circuitry for connecting said fifth number of registers' inputs and outputs to said driving segments and said driven segments, respectively.

15. The programmable logic device defined in claim 14 wherein said circuitry comprises a cross point switch.

16. A digital processing system comprising:
processing circuitry;
a memory coupled to said processing circuitry; and
a programmable logic device as defined in claim 1 coupled to the processing circuitry and the memory.

17. A printed circuit board on which is mounted a programmable logic device as defined in claim 1.

18. The printed circuit board defined in claim 17 further comprising:
a memory mounted on the printed circuit board and coupled to the programmable logic device.

19. The printed circuit board defined in claim 17 further comprising:
processing circuitry mounted on the printed circuit board and coupled to the programmable logic device.

20. A programmable logic device comprising:
a plurality of interconnection conductors; and
a register selectively connectable between two of the interconnection conductors so that a signal on one of the interconnection conductors is registered by the register and then passed on by the register to the other of the interconnection conductors.

21. The programmable logic device defined in claim 20 wherein the one of the interconnection conductors is on one side of a partition boundary on the device, and the other of the interconnection conductors is on the other side of the partition boundary, and wherein the register is disposed adjacent the partition boundary.

22. The programmable logic device defined in claim 21 wherein both the one and the other of the interconnection conductors extend substantially perpendicularly away from the partition boundary.

23. The programmable logic device defined in claim 20 further comprising:
first programmable link circuitry configured to select any of a multiplicity of the interconnection conductors as the one of the interconnection conductors; and
second programmable link circuitry configured to select any of a plural number of the interconnection conductors as the other of the interconnection conductors.

24. The programmable logic device defined in claim 23 wherein the multiplicity and the plural number have at least some of the interconnection conductors in common.

25. The programmable logic device defined in claim 20 wherein at least a first of the interconnection conductors in the multiplicity is disposed on one side of a partition boundary on the device, and at least a second of the interconnection conductors in the multiplicity is disposed on the other side of the partition boundary.

26. The programmable logic device defined in claim 25 wherein the first and second conductors both extend away from the partition boundary.

27. The programmable logic device defined in claim 26 wherein the register is disposed adjacent to the partition boundary.

28. The programmable logic device defined in claim 23 wherein at least a first of the interconnection conductors in the plural number is disposed on one side of a partition boundary on the device, and at least a second one of the interconnection conductors in the plural number is disposed on the other side of the partition boundary.

29. The programmable logic device defined in claim 28 wherein the first and second conductors both extend away from the partition boundary.

30. The programmable logic device defined in claim 29 wherein the register is disposed adjacent the partition boundary.

31. The programmable logic device defined in claim 25 wherein at least a first of the interconnection conductors in the plural number is disposed on the one side of the partition boundary, and at least a second of the interconnection conductors in the plural number is disposed on the other side of the partition boundary.

32. The programmable logic device defined in claim 31 wherein the first and second interconnection conductors in both the multiplicity and the plural number extend away from the partition boundary.

33. The programmable logic device defined in claim 32 wherein the register is disposed adjacent the partition boundary.

34. The programmable logic device defined in claim 20 further comprising:
buffer circuitry selectively connectable between the two interconnection conductors as an alternative to connection of the register between the two interconnection conductors.

35. The programmable logic device defined in claim 34 wherein the buffer circuitry is programmable to buffer a signal in either direction between the two interconnection conductors.

36. The programmable logic device defined in claim 20 wherein the register is one of a plurality of registers, and wherein the device further comprises:
first programmable link circuitry configured select any of multiplicity of the interconnection conductors for connection to any one of the registers so that a signal on the selected interconnection conductor can be registered by that register.

37. The programmable logic device defined in claim 36 further comprising:
second programmable link circuitry configured to choose any of a plural number of the interconnection conductors for connection to any one of the registers so that the chosen interconnection conductor receives the signal passed on by that register.

38. A programmable logic device comprising:
a first plurality of architectural blocks;
a first interconnection conductor configured for possible use in conveying signals between the architectural blocks in the first plurality;
a second plurality of architectural blocks;
a second interconnection conductor configured for possible use in conveying signals between the architectural blocks in the second plurality; and
register circuitry dedicated for possible use in receiving a signal from one of the first and second conductors, registering that signal, and then applying the registered signal to the other of the first and second conductors.

39. The programmable logic device defined in claim 38 further comprising:
buffer circuitry configured to selectively apply the signal from one of the first and second conductors to the other of the first and second conductors as an alternative to use of the register circuitry.

40. The programmable logic device defined in claim 38 wherein the register circuitry is configured to operate in either direction between the first and second conductors.

41. The programmable logic device defined in claim 39 wherein the buffer circuitry is configured to operate in either direction between the first and second conductors.

42. A programmable logic device comprising:
   a first plurality of architectural blocks;
   a first multiplicity of interconnection conductors configured for possible use in conveying signals between the architectural blocks in the first plurality;
   a second plurality of architectural blocks;
   a second multiplicity of interconnection conductors configured for possible use in conveying signals between the architectural blocks in the second plurality; and
   register circuitry dedicated for possible use in receiving a signal from one of the conductors in at least one of the first and second multiplicities, registering that signal, and then applying the registered signal to at least one of the other conductors in at least one of the first and second multiplicities.

43. The programmable logic device defined in claim 42 wherein the register circuitry comprises:
   programmable link circuitry configured to select any of the conductors in at least one of the first and second multiplicities as the conductor from which the register circuitry registers the signal.

44. The programmable logic device defined in claim 42 wherein the register circuitry comprises:
   programmable link circuitry configured to select any of the conductors in at least one of the first and second multiplicities as the conductor to which the register circuitry applies the registered signal.

45. The programmable logic device defined in claim 43 wherein the register circuitry further comprises:
   further programmable link circuitry configured to select any of the conductors in at least one of the first and second multiplicities as the conductor to which the register circuitry applies the registered signal.

46. A programmable logic device comprising:
   a first plurality of architectural blocks;
   a first multiplicity of interconnection conductors configured for possible use in conveying signals between the architectural blocks in the first plurality;
   a second plurality of architectural blocks;
   a second multiplicity of interconnection conductors configured for possible use in conveying signals between the architectural blocks in the second plurality; and
   a plural number of register circuits dedicated for possible use in receiving signals from respective ones of the conductors in at least one of the first and second multiplicities, registering those signals, and applying the registered signals to other conductors in at least one of the first and second multiplicities.

47. The programmable logic device defined in claim 46 further comprising:
   programmable link circuitry configured to selectively apply the signal on any one of the conductors in at least one of the first and second multiplicities to any of the register circuits.

48. The programmable logic device defined in claim 46 further comprising:
   programmable link circuitry configured to selectively apply the signal registered by any one of the register circuits to any one of the conductors in at least one of the first and second multiplicities.

49. The programmable logic device defined in claim 48 further comprising:
   further programmable link circuitry configured to selectively apply the signal registered by any one of the register circuits to any one of the conductors in at least one of the first and second multiplicities.

50. The programmable logic device defined in claim 49 wherein the number of the register circuits is less than the number of conductors in either of the first and second multiplicities.

* * * * *